United States Patent [19]

Vermeersch et al.

[11] Patent Number: 6,165,689
[45] Date of Patent: Dec. 26, 2000

[54] METHOD FOR MAKING POSITIVE WORKING PRINTING PLATES FROM A LIGHT SENSITIVE IMAGING ELEMENT

[75] Inventors: Joan Vermeersch, Deinze; Marc Van Damme, Heverlee; Dirk Kokkelenberg, St. Niklaas, all of Belgium

[73] Assignee: AGFA-Gevaert, N.V., Mortsel, Belgium

[21] Appl. No.: 09/161,285

[22] Filed: Sep. 28, 1998

Related U.S. Application Data

[60] Provisional application No. 60/069,921, Dec. 17, 1997.

[30] Foreign Application Priority Data

Oct. 8, 1997 [EP] European Pat. Off. ............... 97203128

[51] Int. Cl.$^7$ ........................................ G03F 7/016
[52] U.S. Cl. .................. 430/302; 430/273.1; 430/278.1; 430/302; 430/162; 430/168; 430/169; 430/271.1; 430/160
[58] Field of Search ................................ 430/160, 278.1, 430/273.1, 302, 162, 168, 169, 325, 326, 328, 330

[56] References Cited

U.S. PATENT DOCUMENTS

| | | |
|---|---|---|
| 2,772,160 | 11/1956 | Hepher . |
| 3,549,373 | 12/1970 | Hamada et al. . |
| 4,748,101 | 5/1988 | Barton ...................................... 430/160 |
| 4,803,145 | 2/1989 | Suzuki et al. ........................... 430/166 |
| 4,985,344 | 1/1991 | Uchino et al. .......................... 430/325 |
| 5,370,965 | 12/1994 | Kondo et al. . |
| 5,466,557 | 11/1995 | Haley et al. . |

FOREIGN PATENT DOCUMENTS 2 205 843  12/1988  United Kingdom .

*Primary Examiner*—Cynthia Hamilton
*Assistant Examiner*—Barbara Gilmore
*Attorney, Agent, or Firm*—Breiner & Breiner

[57] ABSTRACT

According to the present invention there is provided a method for making lithographic printing plates including the following steps:

a) preparing a light sensitive imaging element having on a lithographic base with a hydrophilic surface a first layer including a polymer, soluble in an aqueous alkaline solution and a top layer on the same side of the lithographic base as the first layer which top layer is unpenetrable for an alkaline developer containing $SiO_2$ as silicate;

b) exposing imagewise said light sensitive imaging element to actinic light;

c) developing said imagewise exposed light sensitive imaging element with said alkaline developer so that the exposed areas of the top layer and the underlying areas of the first layer are dissolved and the unexposed areas of the first layer remain undissolved characterized in that said top layer includes a diazonium salt and for at least 20% of its weight one or more non-proteinic hydrophilic film-forming polymers.

11 Claims, No Drawings

METHOD FOR MAKING POSITIVE WORKING PRINTING PLATES FROM A LIGHT SENSITIVE IMAGING ELEMENT

This application claims the benefit of U.S. Provisional application Ser. No. 60/069,921 filed Dec. 17, 1997.

FIELD OF THE INVENTION

The present invention relates to a method for preparing a lithographic printing plate using a light sensitive imaging element.

More specifically the invention is related to a method for preparing a lithographic printing plate using a light sensitive imaging element whereby the capacity of the top layer of being penetrated and/or solubilised by an aqueous developer is changed upon exposure.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

U.S. Pat. No. 3,549,373 discloses a multi-layer reversible copy sheet on which a positive image is obtainable from a negative original, wherein said sheet comprises a non-metallic base, an intermediate layer on said base, and a light-sensitive diazo compound-containing layer on said intermediate layer, wherein said intermediate layer is formed of a resin that comprises a water-soluble alkali metal salt of a copolymer of a vinyl compound, and an unsaturated organic carboxylic acid.

U.S. Pat. No. 5 466 557 discloses a radiation-sensitive composition comprising (1) a resole resin, (2) a novolac resin, (3) a latent Bronsted acid, (4) an infrared absorber, and (5) terephthalaldehyde.

DE-A- 4 241 717 discloses a positive working light-sensitive composition, characterized in that it comprises a diazonium salt and an alkali-soluble polymer.

However there exist no positive working printing plate obtained from a photosensitive element containing diazonium salts as light sensitive substance. Most actual positive working printing plates are obtained from photosensitive elements using chinone diazide derivatives as light sensitive substance. Chinone diazide derivatives are difficult to synthesize and therefore expensive where diazonium salts are easier to synthesize and herefore cheaper. So, there is a long-felt need for photosensitive elements containing diazonium salts which yield positive printing plates.

OBJECTS OF THE INVENTION

It is an object of the invention to provide a method, using cheaper light sensitive imaging elements, for making lithographic printing plates having excellent printing properties, developable in selective, rapid convenient and ecological way.

It is further an object of the present invention to provide a method for making positive lithographic printing plates from a heat mode sensitive imaging element having a high infrared sensitivity.

Further objects of the present invention will become clear from the description hereinafter.

SUMMARY OF THE INVENTION

According to the present invention there is provided a method for making lithographic printing plates including the following steps:

a) preparing a light sensitive imaging element having on a lithographic base with a hydrophilic surface a first layer including a polymer, soluble in an aqueous alkaline solution and a top layer on the same side of the lithographic base as the first layer which top layer is unpenetrable for an alkaline developer containing $SiO_2$ as silicate;

b) exposing imagewise said light sensitive imaging element to actinic light;

c) developing said imagewise exposed light sensitive imaging element with said alkaline developer so that the exposed areas of the top layer and the underlying areas of the first layer are dissolved and the unexposed areas of the first layer remain undissolved characterized in that said top layer includes a diazonium salt and for at least 20% of its weight one or more non-proteinic hydrophilic film-forming polymers.

DETAILED DESCRIPTION OF THE INVENTION

According to the present invention there is provided a method for making lithographic printing plates including the following steps:

a) preparing a light sensitive imaging element having on a lithographic base with a hydrophilic surface a first-layer including a polymer, soluble in an aqueous alkaline solution and a top layer on the same side of the lithographic base as the first layer which top layer is unpenetrable for an alkaline developer containing $SiO_2$ as silicate;

b) exposing imagewise said light sensitive imaging element to actinic light;
c) developing said imagewise exposed light sensitive imaging element with said alkaline developer so that the exposed areas of the top layer and the underlying areas of the first layer are dissolved and the unexposed areas of the first layer remain undissolved characterized in that said top layer includes a diazonium salt and for at least 20% of its weight one or more non-proteinic hydrophilic film-forming polymers.

The top layer, in accordance with the present invention comprises a diazonium salt. A mixture of diazonium salts may be used, but it is preferred to use only one diazonium salt.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in DE-A- 1 214 086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

The amount of diazonium salt lies between 5 and 50% by weight of the top layer, more preferably between 10 and 30% by weight.

The water soluble top layer comprises as a binder resin in accordance with the present invention an aqueous soluble non-proteinic hydrophilic film-forming polymer, preferably in an amount by weight of at least 30%. Suitable polymers are e.g. polyvinyl alcohol, poly(meth)acrylic acid, polyvinyl pyrrolidone, polyethylene oxide, partly hydrolyzed polyvinyl acetate, sulphonated polystyrene, hydroxyethyl cellulose, carboxymethyl cellulose, cellulose acetate hydrogen phthalate, dextran, dextrins or derivatives thereof, starch, gum arabic, alginic acid derivatives such as salts or esters thereof and copolymers containing acetal groups and hydroxy groups which have at least partially reacted with a compound with at least two carboxyl groups. It is also possible to use mixtures of two or more different non-proteinic hydrophilic film-forming polymers in order to obtain said 20% , more preferably said 30% of the weight of the aqueous soluble top layer. Preference is given, however, to at least one polyvinyl alcohol preferably having a molecular weight of at least 10,000 more preferably of at least 50,000. Said polyvinylalcohol has a hydrolysis degree of at least 80%, more preferably of at least 95%

The total amount of the top layer preferably ranges from 0.05 to 10 g/m$^2$ more preferably from 0.1 to 2 g/m$^2$.

In the top layer a difference in the capacity of being penetrated and/or solubilised by the aqueous alkaline solution is generated upon image-wise exposure for an alkaline developer according to the invention.

In the present invention the said capacity is increased upon image-wise exposure to actinic light to such degree that the imaged parts will be cleaned out during development without solubilising and/or damaging the non-imaged parts.

The development with the aqueous alkaline solution is preferably done within an interval of 5 to 120 seconds.

Between the top layer and the lithographic base the present invention comprises a first layer soluble in an aqueous developing solution, more preferably an aqueous alkaline developing solution with preferentially a pH between 7.5 and 14. Said layer is preferably contiguous to the top layer but other hydrophilic layers can be present between the top layer and the first layer. The alkali soluble binders used in this layer are preferably hydrophobic binders as used in conventional positive or negative working PS-plates e.g. novolac, polyvinyl phenols, carboxy substituted polymers etc. Typical examples of these polymers are described in DE-A-4 007 428, DE-A-4 027 301 and DE-A-4 445 820. The hydrophobic binder used in connection with the present invention is further characterised by insolubility in water and partial solubility/swellability in an alkaline solution and/or partial solubility in water when combined with a cosolvent.

Said first layer preferably also includes a low molecular acid, preferably a carboxylic acid, still more preferably a benzoic acid, most preferably 3, 4, 5-trimethoxybenzoic acid.

The weight ratio between the total amount of low molecular acid and polymer in the first layer preferably ranges from 2:98 to 40:60, more preferably from 5:95 to 20:80. The total amount of said first layer preferably ranges from 0.1 to 10 g/m$^2$, more preferably from 0.3 to 2 g/m$^2$.

In the imaging element according to the present invention, the lithographic base can be an anodised aluminum. A particularly preferred lithographic base is an electrochemically grained and anodised aluminum support. The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried ou at room temperature or can be carried out at a slightly elevated temperature of about 30 to 50° C. A further interesting treatment involves rinsing the aluminum oxide surface with a bicarbonate solution.

Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evidence that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment in connection with the present invention, the lithographic base having a hydrophilic surface comprises a flexible support, such as e.g. paper or plastic film, provided with a cross-linked hydrophilic layer. A Particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

As flexible support of a lithographic base in connection with the present embodiment it is particularly preferred to use a plastic film e.g. substrated polyethylene terephthalate film, cellulose acetate film, polystyrene film, polycarbonate film etc. . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per m$^2$ and 750 mg per m$^2$. Further, the ratio of silica to hydrophilic binder is preferably more than 1 and the surface area of the colloidal silica is preferably at least 300 m$^2$ per gram, more preferably at least 500 m$^2$ per gram.

In order to obtain a lithographic plate the light sensitive imaging element according to the invention is first image-wise exposed to actinic light and then developed in an aqueous alkaline solution.

Actinic light is light that is absorbed by the diazonium salt i.e. UV or blue light.

After the image-wise exposure the light sensitive imaging element is developed by rinsing it with an aqueous alkaline solution. The aqueous alkaline solutions used in the present invention are those that are used for developing conventional positive working presensitised printing plates and have preferably a pH between 11.5 and 14. Thus the imaged parts of the top layer that were rendered more penetrable for the aqueous alkaline solution upon exposure and the parts of the underlying layer are cleaned-out whereby a positive working printing plate is obtained.

In the present invention, the composition of the developer used is also very important.

Therefore, to perform development processing stably for a long time period particularly important are qualities such as strength of alkali and the concentration of silicates in the developer. Under such circumstances, the present inventors have found that a rapid high temperature processing can be performed, that the amount of the replenisher to be supplemented is low and that a stable development processing can be performed over a long time period of the order of not less than 3 months without exchanging the developer only when the developer having the foregoing composition is used.

The developers and replenishers for developer used in the invention are preferably aqueous solutions mainly composed of alkali metal silicates and alkali metal hydroxides represented by MOH or their oxyde, represented by M$_2$O, wherein said developer comprises SiO$_2$ and M$_2$O in a molar ratio of 0.5 to 1.5 and a concentration of SiO$_2$ of 0.5 to 5% by weight. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono- or di- isopropylamine, n-butylamine, mono-, di- or triisopropanolamine, ethyleneimine, ethylenediimine and tetramethylammonium hydroxide.

In the present invention, particularly important is the molar ratio in the developer of [SiO$_2$]/[M$_2$0], which is generally 0.5 to 1.5, preferably 0.7 to 1.3. This is because if the molar ratio is less than 0.5, great scattering of activity is observed, while if it exceeds 1.5, it becomes difficult to perform rapid development and the dissolving out or removal of the light-sensitive layer on exposed areas is liable to be incomplete. In addition, the concentration of SiO$_2$ in the developer and replenisher preferably ranges from 1 to 4 % by weight. Such limitation of the concentration of SiO$_2$ makes it possible to stably provide lithographic printing plates having good finishing qualities even when a large amount of plates according to the invention are processed for a long time period.

In a particular preferred embodiment, an aqueous solution of an alkali metal silicate having a molar ratio [SiO$_2$]/[M$_2$O], which ranges from 1.0 to 1.5 and a concentration of SiO$_2$ of 1 to 4 % by weight is used as a developer. In such case, it is a matter of course that a replenisher having alkali strength equal to or more than that of the developer is employed. In order to decrease the amount of the replenisher to be supplied, it is advantageous that a molar ratio, $[SiO_2]/[M_2O]$, of the replenisher is equal to or smaller than that of the developer, or that a concentration of $SiO_2$ is high if the molar ratio of the developer is equal to that of the replenisher.

In the developers and the replenishers used in the invention, it is possible to simultaneously use organic solvents having solubility in water at 20° C. of not more than 10% by weight according to need. Examples of such organic solvents are such carboxilic acid esters as ethyl acetate, propyl acetate, butyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 5% by weight and preferably not more than 4% by weight.

The developers and replenishers used in the present invention may simultaneously contain a surfactant for the purpose of improving developing properties thereof. Examples of such surfactants include salts of higher alcohol (C8–C22) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate, sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactanzs may be used in an amount of generally not more than 5% by weight and preferably not more than 3% by weight.

In order to enhance developing stability of the developers and replenishers used in the invention, the following compounds may simultaneously be used.

Examples of such compounds are neutral salts such as NaCl, KCl and KBr as disclosed in JN-A-58-75 152; chelating agents such as EDTA and NTA as disclosed in JN-A-58-190 952 (U.S. Pat. No. 4,469,776), complexes such as [Co(NH3)6]C13 as disclosed in JN-A-59-121 336 (U.S. Pat. No. 4,606,995); ionizable compounds of elements of the group IIa, IIIa or IIIb of the Periodic Table such as those disclosed in JN-A-55-25 100; anionic or amphoteric surfactants such as sodium alkyl naphthalene sulfonate and N-tetradecyl-N,N-dihydroxythyl betaine as disclosed in JN-A-50-51 324; tetramethyldecyne diol as disclosed in U.S. Pat. No. 4,374,920; non-ionic surfactants as disclosed in JN-A-60-213 943; cationic polymers such as methyl chloride quaternary products of p-dimethylaminomethyl polystyrene as disclosed in JN-A-55-95 946; amphoteric polyelectrolytes such as copolymer of vinylbenzyl trimethylammonium chloride and sodium acrylate as disclosed in JN-A-56-142 528; reducing inorganic salts such as sodium sulfite as disclosed in JN-A-57-192 952 (U.S. Pat. No. 4,467,027) and alkaline-soluble mercapto copoounds or thioether compounds such as thiosalicylic acid, cyszeine and thioglycolic acid; inorganic lithium compounds such as lithium chloride as disclosed in JN-A-58-59 444; organic lithium compounds such as lithium benzoate as disclosed in JN-A-50 34 442; organometallic surfactants containing Si, Ti or the like as disclosed in JN-A-59-75 255; organoboron compounds as disclosed in JN-A-59-84 241 (U.S. Pat. No. 4,500,625); quaternary ammonium salts such as tetraalkylammonium oxides as disclosed in EP-A-101 010; and bactericides such as sodium dehydroacetate as disclosed in JN-A-63-226 657.

In the method for development processing of the present invention, any known means of supplementing a replenisher for developer may be employed. Examples of such methods preferably used are a method for intermittently or continuously supplementing a replenisher as a function of the amount of PS plates processed and time as disclosed in JN-A-55-115 039 (GB-A-2 046 931), a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A-58-95 349 (U.S. Pat. No. 4 537 496); a method comprising determining the impedance value of a developer and processing the detected impedance value by a computer to perform supplementation of a replenisher as disclosed in GB-A-2 208 249.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

After the development of an image-wise exposed imaging element with an aqueous alkaline solution and drying, the obtained plate can be used as a printing plate as such. However, to improve durability it is still possible to bake said plate at a temperature between 200° C. and 300° C. for a period of 30 seconds to 5 minutes. Also the imaging element can be subjected to an overall post-exposure to UV-radiation harden the image in order to increase the run lenght of the printing plate.

The following example illustrates the present invention without limiting it thereto. All parts and percentages are by weight unless otherwise specified.

XAMPLE

Positive Working Thermal Plate Based on an Alkali-Soluble Binder

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m² to form a surface topography with an average center-line roughness Ra of 0.5 mm.

After rinsing with demineralized water the aluminum foil was then etched with an aqueous solution containing 300 g/l of sulfuric acid at 60° C for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m$^2$ for about 300 seconds to form an anodic oxidation film of 3.00 g/m$^2$ of $Al_2O_3$ then washed with demineralized water, posttreated with a solution containing polyvinylphosphonic acid and then with a solution containing aluminum trichloride, subsequently rinsed with demineralized water at 20° C. during 120 seconds and dried.

Preparation of the First Layer

To 740 g of tetrahydrofuran and 503 g of methoxypropanol was added a solution of 48 g alnovol in 74 g of methoxypropanol and 6.55g of 3,4,5-trimethoxybenzoic acid and said solution was coated on the anodized layer of the aluminum support at a wet thickness of 20 μm, giving a dry weight of 0.76 g/m$^2$.

Preparation of the Top Layer

On the first layer was coated a layer from an aqueous solution containing 0.09 g/m$^2$ of the condensation product of diphenylamine diazonium salt and formaldehyde and 0.51 g/m$^2$ of 98% hydrolyzed polyvinyl acetate (POLYVIOL W48/20 available from Cracker).

The photosensitive material was exposed through an UGRA-wedge with a CDL 1205 (a 1200 W metal halogen lamp level 3) The exposed photosensitive imaging element is developed in an alkaline silicate containing developing solution (75% EP 26 developer commercially available from Agfa), containing 1.16 weight percent of $SiO_2$ and a molar ratio of [$SiO_2$] to [$Na_2O$] of 0.59.dissolving very rapidly the exposed parts.

This plate was printed on a Heidelberg GTO 46 printing machine with a conventional ink (K+E197) and fountain solution (Rotamatic) resulting in good prints, i.e. no scumming in non imaged parts and good ink-uptake in imaged parts.

We claim:

1. A method for making lithographic printing plates including the following steps:
   a) preparing a light sensitive imaging element having on a lithographic base with a hydrophilic surface a first layer including a polymer, soluble in an aqueous alkaline solution and a top layer on the same side of the lithographic base as the first layer which top layer is unpenetrable for an alkaline developer containing $SiO_2$ as silicate and which top layer includes diazonium salt and for at least 20% of its weight one or more non-proteinic hydrophilic film-forming polymers;
   b) exposing imagewise said light sensitive imaging element to actinic light;
   c) developing said imagewise exposed light sensitive imaging element with said alkaline developer so that the exposed areas of the top layer and the underlying areas of the first layer are dissolved and the unexposed areas of the first layer remain undissolved.

2. A method for making lithographic printing plates according to claim 1 wherein the water soluble top layer comprises a water soluble non-proteinic hydrophilic film-forming polymer in an amount by weight of at least 30%.

3. A method for making lithographic printing plates according to claim 1 wherein said water soluble non-proteinic hydrophilic film-forming polymer is polyvinyl alcohol.

4. A method for making lithographic printing plates according to claim 3 wherein said polyvinyl alcohol has a molecular weight of at least 50,000.

5. A method for making lithographic printing plates according to claim 3 wherein said polyvinyl alcohol has a hydrolysis degree of at least 80%.

6. A method for making lithographic printing plates according to claim 1 wherein said water soluble non-proteinic hydrophilic film-forming polymer is a copolymer containing acetal groups and hydroxy groups which have at least partially reacted with a compound with at least two carboxyl groups.

7. A method for making lithographic printing plates according to claim 1 wherein said diazonium salt is a diazo resin.

8. A method for making lithographic printing plates according to claim 1 wherein said alkaline developer comprises $SiO_2$ and $M_2O$ in a molar ratio of 0.5 to 1.5 and a concentration of $SiO_2$ of 0.5 to 5% by weight, wherein $M_2O$ is an alkali metal oxide.

9. A method for making lithographic printing plates according to claim 8 wherein said imagewise exposed light sensitive imaging element is developed with an alkaline developer containing $SiO_2$ in the range from 1 to 4 % by weight.

10. A method for making lithographic printing plates according to claim 8 wherein said imagewise exposed light sensitive imaging element is developed with an alkaline developer containing $SiO_2$ and $M_2O$ in a molar ratio of 0.7 to 1.3, wherein $M_2O$ is an alkali metal oxide.

11. A method for making lithographic printing plates according to claim 1 wherein the binder of the first layer is novolac.

* * * * *